United States Patent [19]

Rotman et al.

[11] Patent Number: 5,194,294
[45] Date of Patent: * Mar. 16, 1993

[54] PROCESS FOR PREPARING ELECTRICAL CONNECTION MEANS, IN PARTICULAR INTERCONNECTION SUBSTANCES OF HYBRID CIRCUITS

[75] Inventors: Frédéric Rotman, Tokyo, Japan; Dominique Navarro, Pont de la Maye; Sylvie Mellul, Vitry-sur-Seine, both of France

[73] Assignee: L'Air Liquide, Societe Anonyme pour l'Etude et l'Exploitation des Procedes Georges Claude, Paris, France

[*] Notice: The portion of the term of this patent subsequent to Oct. 22, 2008 has been disclaimed.

[21] Appl. No.: 684,434

[22] Filed: Apr. 11, 1991

Related U.S. Application Data

[63] Continuation of Ser. No. 482,114, Feb. 20, 1990, abandoned.

[30] Foreign Application Priority Data

Feb. 20, 1989 [FR] France ................. 89 02172

[51] Int. Cl.$^5$ .............................................. C23C 26/00
[52] U.S. Cl. ................................... 427/96; 427/374.1
[58] Field of Search ............................. 427/96, 374.1

[56] References Cited

U.S. PATENT DOCUMENTS

| | | | |
|---|---|---|---|
| 4,234,367 | 11/1980 | Herron | 427/96 |
| 4,504,339 | 3/1985 | Kamehara | 427/96 |
| 4,622,240 | 11/1986 | Yext | 427/96 |
| 4,627,160 | 12/1986 | Herron | 427/96 |
| 4,885,038 | 12/1989 | Anderson | 156/89 |
| 4,891,246 | 1/1990 | McEwen | 427/96 |
| 4,964,923 | 10/1990 | Takeuchi | 427/96 |
| 4,965,092 | 10/1990 | Hayduk | 427/96 |
| 5,059,450 | 10/1991 | Mellul | 427/96 |
| 5,071,058 | 12/1991 | Nowotarski | 427/432 |

FOREIGN PATENT DOCUMENTS

0163478 12/1985 European Pat. Off. .

OTHER PUBLICATIONS

W. Yext et al., "A Study of Various Nitrogen-Based Furnace Atmospheres and Their Effects on Copper Thick-Film Conductors and Dielectrics", Hybrid Circuit, No. 12, Jan. 1987, pp. 5-10.

*Primary Examiner*—Shrive Beck
*Assistant Examiner*—Vi Duong Dang
*Attorney, Agent, or Firm*—Browdy and Neimark

[57] ABSTRACT

The invention relates to a process for preparing interconnection substrates of hybrid circuits, comprising effecting on a support the deposition of a thick layer of ink or paste based on a non-noble metal, such as copper or other material having a "copper compatible" formulation, by carrying out in succession a preliminary drying for eliminating solvents at a temperature on the order of 100° C. to 150° C., a firing comprising:

a) a temperature rise incorporating a stage for eliminating polymer resins,
b) a sintering step at a temperature on the order of 600° C. to 1000° C., and
c) a timed cooling, the firing being carried out under a substantially inert gas atmosphere (nitrogen and/or argon and/or helium), the atmosphere of the stage for eliminating the polymer resins having a content of water vapor lower than 15,000 ppm, preferably between 1,000 and 10,000 ppm, while the atmosphere for sintering at high temperature has a content of water vapour in any case lower than 1,000 ppm.

18 Claims, No Drawings

PROCESS FOR PREPARING ELECTRICAL CONNECTION MEANS, IN PARTICULAR INTERCONNECTION SUBSTANCES OF HYBRID CIRCUITS

This application is a continuation of application Ser. No. 07/482,114, filed Feb. 20, 1990, abandoned.

The present invention relates to the production of electrical connection means, in particular hybrid circuit interconnection substrates, of the type comprising effecting on a support the deposition of a thick layer of ink or metal-based paste by carrying out in succession a preliminary drying for eliminating solvents at a temperature on the order of 100° C. to 150° C., a firing comprising:

a) a temperature rise incorporating a stage for eliminating polymer resins, b) a sintering step at a temperature on the order of 600° C. to 1000° C., and c) a timed cooling.

In this electronic interconnection technique, the substrates act as a support and as an interconnection element for the different electronic components constituting the circuit, and for this purpose they are essentially formed by a mechanical support also performing the function of a thermal dissipator, on which are applied conductive, insulating and/or resistive thick layers, which make from varied patterns all of the interconnections.

The thick layers are themselves made from inks or pastes which are essentially constituted by a functional stage, an inorganic binder and an organic vehicle (solvents and polymer resins which impart a good rheology to the paste). The functional stage ensures the electrical properties of the layer with respect to conductivity, resistivity or insulation. It is in the form of powders which are metallic for the conductive layers, based on glass and ceramic for the insulating layers. The inorganic binder has for function to ensure a good adherence between the layer and the support.

In practice, the deposition of a layer of raw ink on the substrate is effected by serigraphy according to a pattern previously formed on a screen: the screen is a sieve and the deposition is effected by the passage of the ink through the meshes of the sieve; the drying operation is intended to eliminate the solvents, while the firing of the whole at high temperature achieves by sintering and/or fusion of the constituents a film having a thickness of between about 5 microns and about 50 microns which adheres to the surface of the substrate.

The firing of the layers of ink after drying represents a complex heat treatment operation during which the role of the atmosphere is primordial. In particular, the atmosphere has for purpose to constitute an adequate environment for carrying out as correctly as possible the operations for sintering and adhering the layer to the substrate.

In the case of conductive inks based on noble metals such as platinum, gold, palladium, silver, and also the compatible resistive and insulating inks, the firing is carried out under an oxidizing atmosphere, usually under air. The use of an oxidizing atmosphere such as air is quite appropriate for the operation eliminating the polymer resins remaining in the layer after drying. The oxygen present in the atmosphere facilitates this elimination of the resins by oxidation of the organic compounds which are vaporized and pyrolyzed with rise in temperature.

On the other hand, in the case of conductive inks based on a non-noble metal such as copper or other so-called compatible materials, the firing requires an inert atmosphere obtained by the use of neutral gases such as nitrogen, argon, helium, if need be a combination of these gases, so as to avoid the oxidation of the metal. In such an inert atmosphere, the elimination of the polymer resins is often incomplete and this results in a certain number of deteriorations of the layers, in particular a reduction in their adherence to the substrate. The mechanisms giving rise to these deteriorations have been studied and are in particular described by R. J. BACHER and V. P. SIUTA in an article entitled "Firing Process-related Failure Mechanisms in Thick Film Copper Multilayers" which appeared in the "Proc of the Electronic Components Conference, IEEE", 1986, pp. 471–480.

However, bearing in mind its particularly exceptional properties (high electric conductivity, excellent solderability with tin-lead, etc.), and its low cost, copper remains a material in demand for many applications in microelectronics. This is the reason why for several years a large number of studies have been made on the improvement of the elimination of the organic compounds in the technique employing these materials.

The search for a solution which is as simple and complete as possible has lead to the study of the doping of the inert firing atmosphere with a gas or a mixture of gases which are reactive with respect to the organic compounds without altering the copper. It is for example known that the addition of hydrogen and water vapour in a neutral atmosphere permits controlling the oxido-reducing power of this atmosphere. It is in this way possible to determine theoretically contents of hydrogen and water vapour whose combined effect is oxidizing with respect to the polymer resins, neutral with respect to the copper throughout the considered firing cycle. Other gaseous dopes such as CO and $CO_2$ may also be envisaged. Thus, W. YEXT, E. A. HAYDUK have studied such a solution and describe the effect of various dopes in an article entitled "A Study of Various Nitrogen-based Furnace Atmospheres and Their Effects on Copper Thick-film Conductors and Dielectrics" which appeared in "Hybrid Circuits, Number 12", January 1987, pp. 5–10 with the conclusion that certain gases such as CO, $CO_2$, $H_2O$, $H_2$, when added to the nitrogen-based firing atmosphere, deteriorate at least one of the physical properties (resistivity, adherence, solderability) of the thick copper layers treated in this way.

In the case of combined additions of hydrogen and water vapour, these authors mention that the adherence fails to occur and that the resistivity of the layers is higher than that obtained when firing under an atmosphere of nitrogen without addition. Moreover, in the case of simple additions of water vapour up to contents of 1.75%, they found that the adherence of the thick copper layer on a 96% alumina substrate deteriorates with increase in the content of water vapour.

An object of the present invention is to provide an atmosphere for producing thick layers which, in the case of ink or paste based on non-noble metals, such as copper or other compatible materials, ensures a good adherence of the layers, an excellent and reproducible quality of the electrical, mechanical and thermal properties of the electronic element, which conditions are necessary for the realization and the good operation of electronic circuits.

These objects are attained in a particularly surprising manner according to the invention in that the atmosphere of the stage for eliminating the polymer resins presents a content of water vapour lower than 20000 ppm preferably between 1000 and 10000 ppm, while the sintering atmosphere at a high temperature has in any case a lower content of water vapour, in any case lower than 1000 ppm, the firing atmospheres being substantially devoid of hydrogen.

According to one manner of carrying out the invention, the content of water vapour of the atmosphere of the stage for eliminating the polymer resins is higher than 50 ppm. Likewise, it is preferable to arrange that the content of water vapour of the sintering atmosphere at high temperature be lower than 250 ppm.

These results, which appear to contradict the aforementioned works of YEXT, HAYDUCK and FISHER, appear to come from a finer and more subtle approach to the consitution of the treatment atmospheres. The first deduction which may be made is that it is necessary to differentiate an atmosphere for eliminating the polymer resins from a sintering atmosphere in that the first of these atmospheres becomes quite satisfactory with a given content of water vapour, preferably between on the order of 1000 ppm and 10000 ppm, whereas the sintering atmosphere, which is at a distinctly higher temperature, must necessarily have its water vapour content reduced. This may be easily achieved in continuous furnaces by distinctly differentiating the zone for eliminating the polymer resins and the sintering zone.

According to one manner of carrying out the invention, the atmosphere of the stage for eliminating the polymer resins comprises an oxygen content which may be as much as several tens of ppm, while the oxygen content of the sintering and cooling atmosphere remains lower than 10 ppm.

It is interesting to note that, in the presence of contents of water vapour, a residual content of oxygen solely in the atmosphere for eliminating the polymer resins has a beneficial effect, while this oxygen must be practically forbidden from the sintering atmosphere at high temperature.

According to a preferred manner of carrying out the invention, the atmosphere for eliminating the polymer resins is formed by a current of inert gas to which are added proportions of oxygen and hydrogen for the catalytic formation of water vapour, with a substantially total elimination of the hydrogen, if required with a given oxygen residue, so as to obtain the predetermined content of water vapour, and, as the case may be, the content of oxygen.

This manner of proceeding, which is substituted for the usual bubbling, is of particular interest, since it permits a strict regulation of the values of the content of water vapour and the residual content of oxygen, which assures an industrial reproducibility and a possibility of an automatization of productions which are altogether reliable.

The invention will now be described with an example of carrying out the invention:

Copper-based commercial inks were used and fired under different nitrogen-based atmospheres after having been serigraphed and dried in proceeding in the usual manner employed in industry.

The chosen pattern of the tests comprises, among others, a lyre for evaluating the resistivity and studs of different sizes for evaluating the adherence. The studs are square with 1.5 mm or 2 mm sides. This pattern was serigraphed on square substrates of alumina with 50.8 mm sides. The degree of purity of the alumina is 96%.

The firings under atmospheres were carried out in a conventional industrial passage furnace comprising a conveyor belt. The complete firing cycle chosen lasts 55 minutes with a sintering step at 900° C. ±2° C. lasting about 10 minutes.

After firing, a group of electrical and mechanical tests were carried out, comprising measurements of adherence, resistivity, solderability, aptitude for microcabling.

For the adherence, which is a particularly critical parameter in the case of thick copper layers, the procedure was as follows. Copper hooks were soldered with tin-lead-silver (62-36-2) at 215° C. on copper studs. These hooks were then subjected to tensile tests and the rupture forces were measured so as to evaluate the adherence power.

The aging consisted in placing in an oven at 150° C. for 200 hours hooks soldered to the studs before they were subjected to the tensile tests.

Test No. 1 consisted in firing under a nitrogen atmosphere without addition of gaseous dopes, the content of water vapour being 12 ppm, the content of oxygen 4 ppm.

Test No. 2 consisted in firing under a nitrogen atmosphere with addition of water vapour in the zone for eliminating the polymer resins. In this zone for eliminating the polymer resins, the content of water vapour is 8000 ppm (0.8%), the content of oxygen 5 ppm. In the zone of the sintering step, the content of water is 18 ppm and the content of oxygen 3 ppm.

| Comparative results: | | |
|---|---|---|
| | Test No. 1 | Test No. 2 |
| Resistivity of the layer (milliohms/square/18 microns) | 1.4 ± 0.05 | 1.42 ± 0.05 |
| Initial adherence (N/sq.mm) | 25.1 ± 3.5 | 39.6 ± 3.1 |
| Adherence after aging (N/sq.mm) | 21.8 ± 2.0 | 30.4 ± 1.8 |
| Aptitude for microcabling (mN) (thermosonic cabling of gold wire 30 microns in diameter) | 96 ± 7 | 102 ± 9 |
| Solderability (wetting angle) | 28° | 23° |

These results clearly show that the preferential addition of water vapour in the zone for eliminating the polymer resins of the furnace give physical characteristics of thick copper layers which are close, and even slightly improved, as concerns the solderability, the aptitude for microcabling and the resistivity, and very improved by far as concerns both initial adherence and adherence subsequent to aging.

We claim:

1. A process of manufacturing electrical connection components on a substrate, which comprises the preliminary step of depositing on the substrate a non-noble metal-base plate, and wherein the substrate and the deposited paste are subject to the following successive steps:

drying at a first temperature lower than 150° C. under a first atmosphere;

firing by raising the temperature from said first temperature to a second temperature lower than 600° C. under a second atmosphere consisting essentially of an inert gas selected from the group consisting of nitrogen, argon, helium, and mixtures thereof, oxygen and including a first amount of water vapor at a content greater than 50 ppm and lower than 20,000 ppm;

sintering at a third temperature between 600° C. and 1,000° C. under a third atmosphere consisting essentially of an inert gas selected from the group consisting of nitrogen, argon, helium, and mixtures thereof, and including a second amount of water vapor at a content less than said first amount and lower than 1,000 ppm, and cooling progressively under a fourth atmosphere.

2. The process of claim 1, wherein the content of water vapor in said second atmosphere is between 1,000 and 10,000 ppm.

3. The process of claim 2, wherein the content of water vapor in the third atmosphere is lower than 250 ppm.

4. The process of claim 1, wherein the second atmosphere includes oxygen at a content less than 100 ppm.

5. The process of claim 4, wherein the third atmosphere includes oxygen at a content lower than 10 ppm.

6. The process of claim 2, wherein the second atmosphere includes oxygen at a content less than 100 ppm.

7. The process of claim 6, wherein the third atmosphere includes oxygen at a content lower than 10 ppm.

8. The process of claim 7, wherein the fourth atmosphere includes oxygen at a content lower than 10 ppm.

9. The process of claim 3, wherein said inert gas is nitrogen.

10. The process of claim 9, wherein said non-noble metal is copper.

11. The process of claim 1 wherein said sintering temperature is sufficiently high to fuse the inorganic binder to said substrate.

12. The process of claim 1 wherein substantially no oxidizing gasses are present during said sintering and cooling steps.

13. The process of claim 1 wherein the concentration of water vapor during said firing step is greater than the concentration of water vapor during said sintering step.

14. A process of manufacturing an electrical circuit printed on a substrate, comprising:

depositing on said substrate a paste comprising a non-noble metal, an inorganic binder, an organic binder and a diluent;

drying said paste at a first temperature less than about 150° C. under a first atmosphere to remove said diluent;

raising the temperature from said first temperature to a second temperature less than 600° C. under a second atmosphere consisting essentially of an inert gas selected from the group consisting of nitrogen, argon, helium, and mixtures thereof, and including water vapor in an amount of from 1000-20,000 ppm, and further including a first quantity of oxygen;

sintering at a third temperature between 600° C. and 1000° C. under a third atmosphere different from second atmosphere and consisting essentially of an inert gas selected from the group consisting of nitrogen, argon, helium and mixtures thereof, and including water vapor in an amount less than 250 ppm, said third atmosphere containing a lesser quantity of oxygen than said first quantity and in an amount of less than 10 ppm; and progressively cooling in an atmosphere substantially free of oxygen.

15. The process of claim 14 wherein said sintering temperature is sufficiently high to fuse the inorganic binder to said substrate.

16. The process of claim 14 wherein substantially no oxidizing gasses are present during said sintering and cooling steps.

17. The process of claim 14 wherein the concentration of water vapor in said second atmosphere is greater than the concentration of water vapor during said sintering step.

18. The process of claim 14 wherein the atmosphere during firing consists essentially of an inert gas selected from the group consisting of nitrogen, argon, helium, and mixtures thereof, and including about 8,000 ppm of water vapor and about 5 ppm of oxygen, and the atmosphere during sintering consists essentially of an inert gas selected from the group consisting of nitrogen, argon, helium, and mixtures thereof, and including about 18 ppm of water vapor and about 3 ppm of oxygen.

* * * * *